United States Patent [19]

Nardi

[11] Patent Number: 4,905,259
[45] Date of Patent: Feb. 27, 1990

[54] METHOD OF CONSTRUCTING BLOCK CODES

[76] Inventor: Jerry S. Nardi, 7815 Mandan Rd., Apt. 203, Greenbelt, Md. 20770

[21] Appl. No.: 182,445

[22] Filed: Apr. 18, 1988

[51] Int. Cl.$^4$ .......................... H04N 1/40; H04N 7/12
[52] U.S. Cl. .................................... 375/122; 358/133; 382/56
[58] Field of Search ................. 341/63, 87, 59, 50, 341/58, 107, 67; 375/122; 358/133, 135, 136, 138, 260; 371/37, 39, 40; 382/41, 43, 50, 56, 9

[56] References Cited

U.S. PATENT DOCUMENTS

| | | | |
|---|---|---|---|
| 4,546,342 | 8/1985 | Weaver et al. | 375/122 |
| 4,598,411 | 7/1986 | Berkovich et al. | 358/260 |
| 4,691,329 | 9/1987 | Juri et al. | 382/56 |
| 4,706,264 | 11/1987 | Cung | 375/122 |
| 4,748,638 | 5/1988 | Friedman et al. | 375/122 |

OTHER PUBLICATIONS

J. Walfowitz, "Coding Theorems of Information Theory,: Erg. Math." (N.F.)31. Berlin-Gottingen-Heidielberg: Springer-Verlag (1959).

I. Csiszar and J. Kroner, *Information Theory: Coding For Discrete Memoryless Systems*, New York: Academic Press (1981).

Primary Examiner—Robert L. Griffin
Assistant Examiner—Stephen Chin
Attorney, Agent, or Firm—Browdy and Neimark

[57] ABSTRACT

A method of selecting at least one code word from a set of second data having at least one data group representing a set of first data having at least one data group including the steps of determining for one of the set of second data, all those data groups in the set of first data covered by the one of the set of second data, eliminating the covered data group from the set of first data, selecting as one of the at least one code word the one of the set of second data which covers the maximum number of data groups in the set of first data, and repeating the above steps until a given criteria is satisfied.

27 Claims, 5 Drawing Sheets

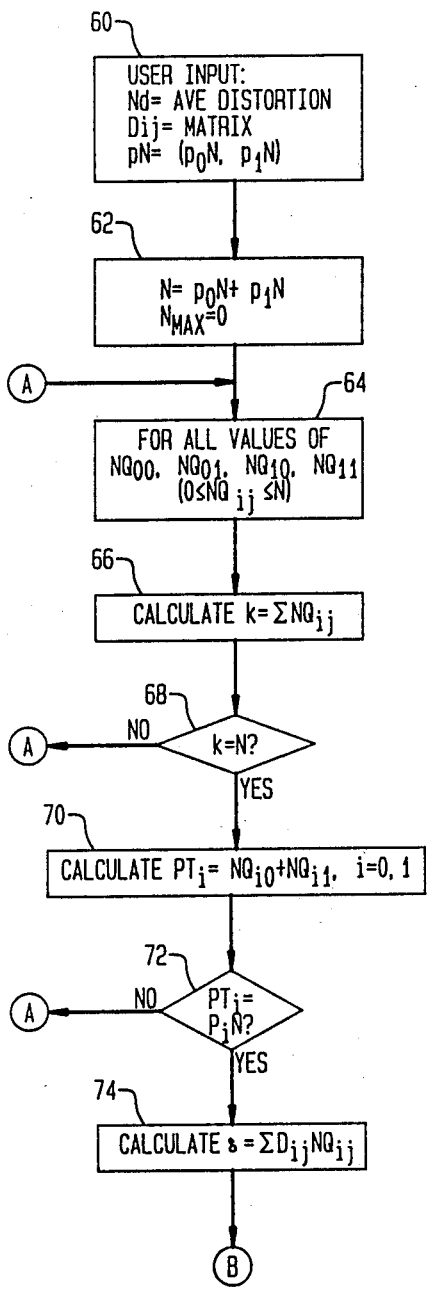

METHOD OF CONSTRUCTING BLOCK CODES

BACKGROUND OF THE INVENTION

1. Field of the Invention

The present invention relates to a method of producing a data compression block code for any finite alphabet source with a given acceptable level of distortion.

2. The Prior Art

The method according to the present invention will produce a data compression block code for any finite alphabet source. The compression rates achievable by this design approach the theoretical limits of data compression as the block size increases.

In general, the present invention presents an efficient technique for data compression. Data compression, or source coding, is used in many technological fields which require transmission of data in a cost-effective and time-effective manner. In particular, the data to be transmitted is converted, using some algorithm, to more compact data which can be transmitted faster than the original source data. In the process of this conversion, errors are introduced creating what is known as distortion. A certain amount of distortion is acceptable, the amount depending upon the particular data and application involved.

Data compression is used in such areas as the transmission of text between two locations, such as facsimile transmission, or the transmission of data for storage such as in image processing. In fact, any type of information can be transmitted more efficiently using data compression techniques, such as through the airwaves, through wires, or between computer storage systems.

Fundamentally the problem of block coding a source (source coding) is to find vectors (code words) of size N which can be used to represent all the source vectors (source words) of size N. In its most abstract definition a source is simply defined to be a set of symbols (alphabet) along with a probability distribution specifying the chance of occurrence of each symbol. If there are r letters in the source alphabet then there are $r^N$ possible vectors of size N. The code words are vectors of size N made up from letters from a reproduction alphabet. If there are s letters in the reproduction alphabet then code words can be chosen from as many as $s^N$ reproduction words.

A person designing a code must specify how to choose M code words from the set of $s^N$ reproduction vectors and he must specify how to associate source words with code words. Usually he wants M to be much less than $r^N$ (compression) so that valuable resources (disk space, transmission energy, transmission time., etc.) are not wasted by representing the full set of $r^N$ messages. Since there are less code words than source words this necessarily means that many source words will be associated with, that is coded by, the same code word. The designer is willing to tolerate this distortion in exchange for the more beneficial efficiency of data compression.

The distortion produced can be quantitatively defined by an r.s distortion matrix {D(a,b)}, where each element of the matrix represents the distortion incurred by representing the source letter a by a reproduction letter b. The distortion between a source word and a code word is the sum of the distortion between each of the corresponding letters in each N-vector. The average distortion, Nd, for the code is the statistical average over all the source words. The average per letter distortion is d (=Nd/N).

When a set of M code words is specified, the association between source word and code word is usually defined by a simple distortion criterion. The code word used to code a source word is one which gives the least distortion.

The code designer is forever concerned with trade-offs between efficiency and distortion. In 1959 C. Shannon produced a theorem which shows the theoretical relationship between the compression rate and average distortion. The proof did not show how to construct a code which achieves the desired compression and distortion, but showed only how many code words would be needed for a given set of source words with a particular average distortion. The theorem has been proven in many ways since then but, until the Doctoral Thesis of the present inventor, (J. Nardi, "Practical Techniques for Source Coding: Constructive Block Coding and Calculating the Compression Rate of Sliding-Block Codes," Univ. of Maryland (1987), incorporated by reference herein and copy attached), there have been no proofs which suggest a practical construction of a code.

An exhaustive search and test of all M combinations of $s^N$ reproduction words will certainly produce an acceptable code, however even for moderate size blocks (8), a code of 5 words would require that over 1 million combinations be tested. This method would proceed more quickly if it could be demonstrated that less than $s^N$ words need to be tried as code word candidates.

In 1980, the present inventor developed a technique for constructing a code which encodes a binary memoryless (independent) source with limiting distortion d. By successively choosing code words to maximally cover particular source vectors, one can derive the same rate distortion function as that calculated by Shannon theory.

According to the 1980 technique, for a given word, of block size N, an acceptable block distortion is chosen. For example, a distortion of 2 means that two of the bits in the source vector are different from their corresponding bits in the reproduction vector, that is, an exclusive OR function:

$$\text{Source}_{D=\begin{smallmatrix}0\\1\end{smallmatrix}} \begin{matrix}\text{Reproduction} & 0 & 1\end{matrix} \begin{pmatrix} 0 & 1 \\ 1 & 0 \end{pmatrix}$$

The first step is to select a starting reproduction vector and find all those source vectors which have a distortion equal to 2 with respect to the chosen reproduction vector. For the starting reproduction vector, the number of source vectors having a distortion of 2 is determined. The first code word is arbitrarily chosen from those reproduction vectors which correspond to the maximum number of source vectors with a distortion of 2. These source vectors are then eliminated from the list. The next code word is then taken from the list of reproduction vectors that yield the maximum count, i.e., have a distortion of 2 with respect to the most number of sources. Again, all the source vectors that have a distortion of 2 with respect to the new code word are then eliminated. This continues until all source vectors are eliminated or until no other code words correspond to that maximum number of source words.

This method had two major disadvantages. First, the source and reproduction alphabet was limited to the binary set {0,1}. Second, no control was allowed over the distortion matrix, which was limited to the exclusive OR distortion matrix.

Other prior techniques of data compression allowed for picking a source code for a given distortion rate using algebraic codes or annealing codes. Both these prior methods were inefficient in that too much processing time was required, too many codes were produced, more than were required, and the user had no control over the distortion which resulted.

The technique according to the present invention differs from methods used in the previous work of Wolfowitz, Csiszar, and Korner (J. Wolfowitz, "Coding Theorems of Information Theory," Erg. Math. (N.F.)31. Berlin-Gottingen-Heidelberg: Springer-Verlag (1959), I, Csiszar and J. Kröner, *Information Theory: Coding for Discrete Memoryless Systems*, New York: Academic Press (1981)) in that the set of block vectors from which code words are chosen is much smaller and thus easier and quicker to search. The method differs from the Nardi, Davisson results of 1980 (J. Nardi and L. Davisson, "Constructive Method for Calculating R(d)," *Proceedings of the* 1980 *Conference on Information Sciences*, Dept. of Elec. Eng., Princeton, N.J. p. 163 (1980)) in that the current technique applies to sources of arbitrary alphabets having any number of symbols, not just binary sources, and it applies to arbitrary distortion matrices, not just the fidelity criterion.

The algorithm according to the present invention uses only strictly typical vectors, which constitutes many less vectors than $s^N$, thus this method of choosing code words is much faster. The work of Wolfowitz is based on searches of typical sets which, although less numerous than the full set of code words, are still much more numerous than the strictly typical set. The work of Csiszar and Korner also uses typical sets. The work of Wolfowitz, Csiszar, Korner also used the more general idea of covering.

The work of Nardi, Davisson used strictly typical sets but was only applicable to binary sources (alphabet={0,1}) with a particular distortion matrix:

$$D = \begin{pmatrix} 0 & 1 \\ 1 & 0 \end{pmatrix}.$$

That work also differed because the previous method of choosing code words was based on a less general idea of maximizing distortion spheres rather than maximizing covering spheres as in the present invention.

SUMMARY OF THE INVENTION

It is an object of the present invention to provide a method of choosing code words to represent a set of source words constructed from a finite alphabet, based on a variable, acceptable distortion rate.

It is a further object of the present invention to provide a method of data compression in which the source alphabet and the reproduction alphabet need not be the same.

It is a further object of the present invention to provide a method of choosing code words using strictly typical vectors.

According to a first embodiment of the present invention, a method of selecting at least one code word from a set of second data having at least one data group representing a set of first data having at least one data group is provided comprising the steps of determining for one of the set of second data, all those data groups in the set of first data covered by the one of the set of second data, eliminating the covered data groups from the set of first data, selecting as one of the at least one code word the one of the set of second data which covers the maximum number of data groups of the remaining data groups in the set of first data, and repeating the above steps until a given criteria is satisfied.

The step of determining comprises the step of selecting a joint probability matrix Q that minimizes mutual information of the set of first data with respect to the set of second data. The sets of first and second data groups each consist of N elements and the step of determining further comprises the step of determining that a data group of the first set is covered by a data group of the second set if, when the elements of the two data groups are paired, each pair with first data element i and second data element j occurs exactly $NQ_{ij}$ times.

According to a second embodiment of the invention, the method also includes the step of eliminating each data group in the set of second data which is covered by the covered data groups in the set of first data.

Means, particularly in the form of computer programs, are provided for selecting at least one code word from a set of second data having at least one data group representing a set of first data having at least one data group comprising determining means for determining, for one of the set of second data, all those data groups in the set of first data covered by the one of the set of second data, eliminating means for eliminating the covered data groups from the set of first data, selecting means for selecting as one of the at least one code word the one of the set of second data which covers the maximum number of data groups remaining in the set of first data, and means for repeating the above steps until a given criteria is satisfied.

Still other objects, features and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to the preferred embodiments of the device, given only by way of example, and with reference to the accompanying drawings, in which:

FIGS. 4A and 4B are flowcharts of a method of selecting the distortion matrix according to the present invention.

DETAILED DESCRIPTION OF THE PREFERRED EMBODIMENTS

Figure 1:
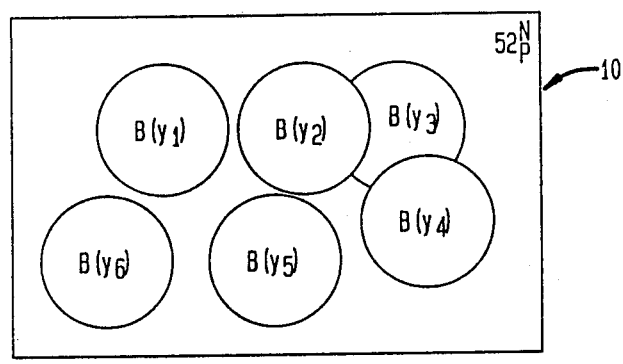
FIG. 1 illustrates a first embodiment of the present invention in circle graph format.

The Np-Sequence Covering Theorem according to the present invention is stated in the above-cited dissertation as follows.

Let $p=(p_1,p_2, \ldots, p_r)$, $q=(q_1, q_2, \ldots, q_{11})$, and $Q=(Q_{ij})$, $i=1,2, \ldots, r$ and $j=1,2, \ldots, s$ be distributions of rational numbers such that for every $i=1,2, \ldots, r$, $$p_i = \sum_{j=1}^{s} Q_{ij}$$

and for every $j=1,2, \ldots, s$, $$q_j = \sum_{i=1}^{r} Q_{ij}.$$

Let $$\Omega_P^N$$

be the set of Np-sequences on an alphabet A with equiprobable probability assignments where there are Np, occurrences of the letter $a_1$, $p_1$ are rational and $Np_1$ are integers, and likewise for $$\Omega_P^N$$

on an alphabet B. Let $$B(y) = \left\{ x \in \Omega_P^N \,\middle|\, x \text{ is covered by } y \right\}.$$

Then for any $\epsilon > 0$ and any $N > N_0$ we can find a code, $$C_N \subset \Omega_q^N,$$

Ps with $J = |C_n|$ such that:

$$P\left( \bigcup_{v \in C_{i-1}} B(y) \right) \to 1 \text{ as } N \to$$

$$\infty \quad 0 \text{ if } \frac{1}{N} \log J > h(p) - h(Q|q) + \epsilon.$$

Also if $C_n$ is any subset of $$\Omega_q^N$$

with $J = |C_n|$, then:

$$P\left( \bigcup_{v \in C_{i-1}} B(y) \right) \to \infty \quad 0 \text{ if } \frac{1}{N} \log J < h(p) - h(Q|q) + \epsilon.$$

For a fixed N, we will specify how to inductively pick a set $C_n$ of coding vectors from $$\Omega_q^N$$

which covers $$\Omega_P^N$$

with high probability. High probability is achieved when the number of source vectors that are covered divided by the total number of source vectors approaches 1. The first vector is chosen arbitrarily. Call it $y_1$ and let $S_1 = B(y_1)$. Let $n_1 = |S_1|$. Suppose we have already chosen vectors $y_1, y_2, \ldots, y_j$; the next code word, $y_{j+1}$, is chosen from the remaining vectors of $$\Omega_q^N - \{y_1, y_2 \ldots, y_j\}$$

so that the number of Np-sequences, that is strictly typical vectors, covered by this additional vector is maximized. In particular, let $$S_j = \bigcup_{i=1}^{j} B(y_i),$$

the set of all strictly typical source vectors already covered by $y_1, y_2, \ldots, y_j$, and $n_j = |S_j|$, then we choose $y_{j+1}$ to maximize $|S_j \cap B(y_{j+1})|$.

According to a first embodiment of the present invention, a basic algorithm is provided to select code words. In practice, the source words are coded to the code word of minimum distortion. The best codes are those from which p and q are related by a joint distribution matrix which minimizes the mutual information given an acceptable amount of distortion.

For a source alphabet $A = \{a_1, a_2, \ldots, a_r\}$ having a probability $p = \{p_1, p_2, \ldots, p_r\}$, with a block size N having $r^N$ possible vectors, the strictly typical vector is determined as follows:

$$\left\{ \begin{array}{l} Np_1 \text{ of } a_1 \\ Np_2 \text{ of } a_2 \\ \vdots \\ Np_n \text{ of } a_n \end{array} \right\}$$

As used in the method according to the present invention, a reproduction vector is said to cover a source vector, or visa versa, if, when the vectors are paired off coordinate to coordinate, the resultant vector is a typical Q vector. This is different from distortion discussed in the prior art description of this disclosure. As used herein, Q is the joint probability or distribution matrix which achieves minimum mutual information subject to the constraint that the average distortion is d or less and the source statistics are p. The Q matrix relates to p (the probabilities on the source alphabet) and q (the probabilities on the reproduction alphabet) such that $q_j$ is the sum of the elements in column j and $p_i$ is the sum of the elements in row i. $Q_{ij}$ is the probability of getting a source letter i and a reproduction letter j. For the algorithm we do not use Q directly but instead use an integer matrix we represent by NQ where each element is a next highest or lowest integer to the value $N.Q_{ij}$ (subject to the constraint that $$\sum_{i,j} NQ_{ij} = N).$$

Integer values for Q elements are achieved by multiplying each element in the matrix by N, the block size.

The methods according to the present invention can work with any NQ. However, in order to achieve close to perfect theoretical limits, NQ must be chosen to be the matrix which minimizes mutual information. For purposes of this invention, Q is related to the definition of coverage. When the elements of the two vectors are paired, each pair with source i and reproduction j must occur exactly $NQ_{ij}$ times in order for a finding that one vector covers the other.

As shown in circle graph format in FIG. 1, the set 10 of $$\Omega_q^N$$

represents the set of all strictly typical source words. To start, pick any $$y_i \epsilon \Omega_q^N$$

as the first code word. To determine the next code word, the number of source words covered by each $$y_i \epsilon \Omega_q^N$$

is determined, shown as circles $B(y_i)$. The code word is chosen as any y which maximizes the coverage. In the graph, $B(y_2)$ through $B(y_4)$, $B(y_6)$ would be chosen as code words. However, $B(y_5)$ does not provide maximum coverage and therefore would not be chosen as a code word.

Figure 2:
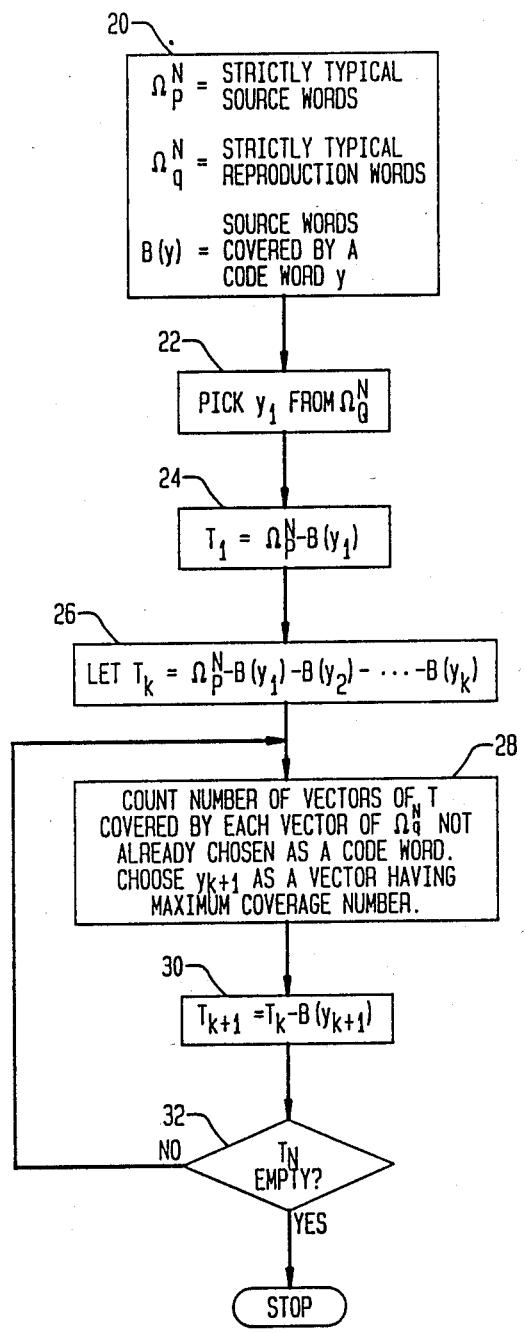
FIG. 2 is a flowchart of the method of selecting code words according to a first embodiment of the present invention.

The algorithm according to the first embodiment of the present invention is illustrated in the flowchart shown in FIG. 2. In step 20, $$\Omega_p^N$$

is the set of all strictly typical source words, $$\Omega_q^N$$

is the set of all strictly typical reproduction words, and $B(y)$ is the set of source words covered by a code word y. In step 22, any reproduction word, $y_1$, is chosen from the set of strictly typical reproduction words, $$\Omega_q^N.$$

In step 24, all those vectors that are covered by $y_1$ are eliminated from $$\Omega_p^N.$$

This reduced set is called $$T_i = \Omega_p^N - B(y_1).$$

At step 26, suppose that code words $y_1, y_2, \ldots, y_k$ have already been chosen. Let $$T_{1c} = \Omega_p^N - B(y_1) - B(y_2) - \ldots - B(y_k).$$

At step 28, the next code word, $y_{k+1}$, is determined by counting the number of vectors of $T_K$ covered by each of the vectors not already chosen as code words. It is understood that when the first code word is chosen it necessarily yields maximum coverage. It is only when vectors of the source words are eliminated that a code word may no longer cover the maximum number of source vectors. In successive iterations of the algorithm, all of the remaining code words are checked to determine which one covers the maximum number of available (that is, not yet eliminated) source words.

A vector $y_{k+1}$ is chosen which has the maximum coverage number, that is covers the maximum number of vectors remaining in the set of source vectors. At step 30, source words covered by $y_{k+1}$ are eliminated from $T_k$ to produce $T_{k+1} = T_k - B(y_{k+1})$. Steps 28 and 30 are repeated until all source words are covered, that is until $T_N$ is empty. Of course, the user can stop the processing at his discretion.

A computer program, written in "C" by the present inventor to implement the method described in this first embodiment is shown in Table I.

Figure 3:
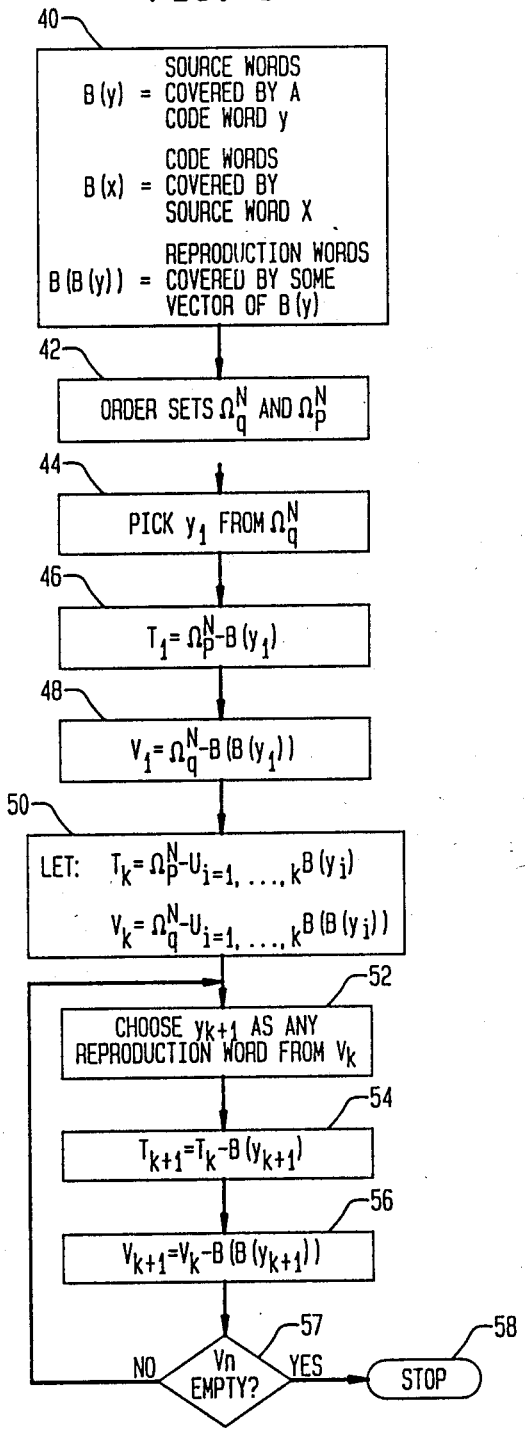
FIG. 3 is a flowchart of the method of selecting code words according to a second embodiment of the present invention.

A second embodiment of the present invention is shown in the flowchart of FIG. 3. The program implementing the second embodiment, shown in Table II, runs more quickly than the basic algorithm of the first embodiment because candidate code words are eliminated at each step, thus fewer covering searches are required. It specifies how to pick code words whose covering spheres are non-intersecting. A code with disjoint coverage usually sacrifices larger distortion for more favorable efficiency.

The sets $$\Omega_p^N \text{ and } \Omega_q^N$$

are the same as described in the first embodiment. In step 40, $B(y)$ is defined as the set of source words covered by a code word y, $B(x)$ is the set of code words covered by a source word x, and $B(B(y))$ is the set of all reproduction words covered by some vector of $B(y)$. At step 42, sets $$\Omega_p^N \text{ and } \Omega_q^N$$

are ordered, for ease of processing. This step may also be done in the algorithm according to the first embodiment of the present invention. At step 44 any reproduction word, $y_1$, is chosen from the set of strictly typical reproduction words, $$\Omega_q^N.$$

At step 46, all those vectors that are covered by $y_1$ are eliminated from $$\Omega_p^N.$$

This reduced set is called $$T_1 = \Omega_p^N - B(y_1).$$

At step 48, all reproduction words which are covered by some source word from $B(y_1)$ are eliminated from $$\Omega_q^N.$$

Let $$V_i = \Omega_q^N - B(B(y_1)).$$

At step 50, suppose code words, $y_1, y_2, \ldots, y_k$, are already chosen. Let $$T_{ic} = \Omega \, {}^N_p - \upsilon \; i-1, \ldots, B(y_i).$$

And let $$V_i = \Omega \, {}^N_q - \upsilon \; i-1, \ldots, K^{B(B(y_i))}.$$

At step 52, the next code word, $y_{k+1}$, is chosen as any reproduction word $V_k$. (This is necessarily of maximum coverage.) At step 54, source words covered by $y_{k+1}$ are eliminated to produce $T_{k+1} = T_k - B(y_{k+1})$. At step 56, reproduction words covered by vectors of $B(y_{k+1})$ are eliminated to form $V_{k+1} = V_k - B(B(y_{k+1}))$. Steps 52, 54 and 56 are repeated until all reproduction words are eliminated, that is until $V_n$ is empty.

Figure 4B:
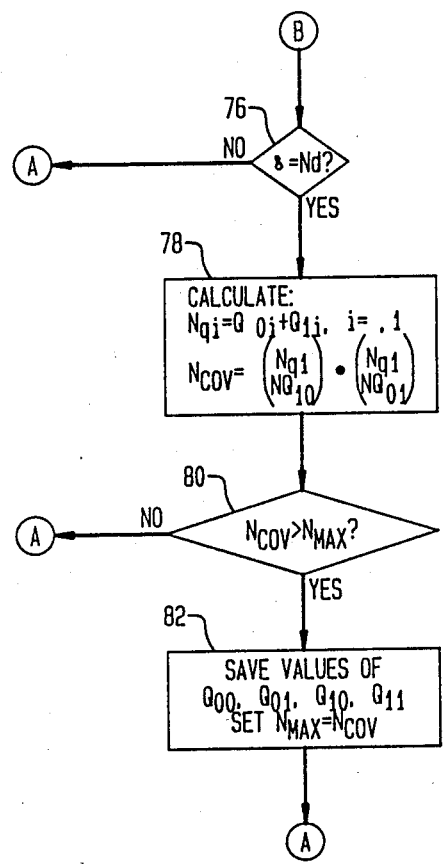

The user of these algorithms chooses the acceptable level of distortion by choosing the appropriate NQ matrix which corresponds to the desired distortion level. As noted above, Q is the joint probability or distribution matrix which achieves minimum mutual information subject to the constraint that the average, per letter distortion is d or less. The average distortion d is selected by the user according to his needs. The NQ matrix may be determined in one of three ways: using Shannon's formula to calculate, by hand, the matrix, using Balhut's algorithm, or by using the algorithm described below and developed by the present inventor. According to this algorithm, as N approaches infinity, $(1/N) \log (N_{cov})$ approaches the results achievable using Shannon's formulas. The algorithm is shown in the flowchart of FIG. 4 and the "C" program implementing this algorithm is shown in Table III.

In step 60, the user inputs the average distortion on block size N, the distortion matrix and the statistics of the source alphabet in block size N. In the example shown in the flowchart, a two-dimensional matrix is used. In step 62, the values for $N_{max}$ and N are set. All possible values of the matrix entries are examined to minimize mutual information. At steps 66 and 68, it is determined whether the value of $Q_{ij}$ is acceptable for block size N. If not, control returns to node A. If so, at steps 70 and 72, it is determined whether the values are consistent with the probability of the source words. If not, control returns to node A. If so, at steps 74 and 76, it is determined whether the average distortion is acceptable. If not, the next incrementation of i,j is examined. If so, at steps 78 and 80, it is determined whether the number of vectors covered by the current matrix is the maximum number covered so far. If so, the matrix is saved and $N_{max}$ is updated. The program continues to loop to find the maximum until all values of $Q_{ij}$ are examined.

For source coding problems, the following rational behind the proof presented in the above-cited doctorate shows why minimizing mutual information is equivalent to maximizing coverage. The mutual information between a source, X, and its code, Y, is defined as:

$$I(X,Y) = H(X) - H(X|Y)$$

where:

$$h_{qj}(Q) = -\sum_{i=1}^{r} \frac{Q_{ij}}{q_j} \log \frac{Q_{ij}}{q_j}, \text{ and}$$

Likewise we define $h(Y)$, $h_{pi}(Q)$, and $h(Y|X)$.

It is assumed here that the source, X, takes on values from a finite set of symbols $A = \{a_1, a_2, \ldots, a_n\}$ with a distribution $(p_1, \ldots, p_n)$, where, for each i, $p_i$ is any real number such that $p_i > 0$ and $$\sum_{i=1}^{r}$$

$$P_i = 1.$$

Also we assume the reproduction letters, Y, are taken from the set $B = \{b_1, b_2, \ldots, b_m\}$ and the letter probabilities, $(q_1, \ldots, q_m)$, are related to those of X by the joint distribution $Q_{ij}$ by $$\sum_{i=1}^{r}$$

$Q_{ij} = q_j$, for all $1 \leq j \leq s$ and $$\sum_{j=1}^{s}$$

$Q_{ij} = p_i$, for all $1 \leq i \leq r$, where $Q_{ij} \geq 0$.

The number of source words covered by a typical code word is given by:

$$|B(y)| = \pi_{j=1}^{S} \binom{Nq_j}{NQ_{ij}, \ldots, NQ_{ij}}.$$

This expression converges, in the $(1/N) \log$ limit to $H(X|Y)$. Since the term $H(X)$ is constant (for the source coding problem) we minimize the mutual information by maximizing the negative term $H(X|Y)$. Hence we can just as well maximize $|B(Y)|$ for finite N.

The algorithm according to the present invention could also be used to choose channel codes. For channel coding applications, that is the correction for errors produced by noise occurring over channels used to transmit information, the object would be to maximize mutual information, that is, to use an NQ matrix which maximizes mutual information. It can be shown that maximizing mutual information is equivalent to minimizing coverage for fixed q.

It is known that one wants to maximize mutual information for efficient channel coding. It is also known that the mutual information can be expressed as:

$$I(X,Y) = H(Y) - H(Y|X)$$

In the $(1/N) \log$ limit, the number of channel output words covered by a channel code word converges to $H(Y|X)$. Hence, for finite N, with fixed values of q, we can just as well use a coverage which is defined by a matrix which minimizes mutual information.

It is understood that the present invention, described herein by means of computer software, can be implemented using hardware or hardwired components without departing from the scope of the invention.

The embodiments described herein are implemented using a two-dimensional NQ matrix and a binary alphabet. However, it is understood that the algorithms can be implemented for larger matrices and any arbitrary alphabet by making appropriate modifications to the programs presented herein.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

TABLE I

```
        int decomp();
        int cover();
        int Newcode();
        int Numcov();

unsigned long int huge typsrc[50000];
unsigned long int huge typrep[50000];
unsigned int far cov[4000], far Clist[8000];
unsigned long int codes[1024];
/* These parameters and variable define the
    mask bits for the source letters, the
    number of bits used in the mask, and the
    size fo the source alphabet.                */
#define XMASK 1
#define NBITR 1
int r=2;
/* These parameters and variable define the
    reproduction alphabet.                     */
#define YMASK 1
#define NBITS 1
int s=2;
unsigned long int Bt = 0x80000000, Fbt=0x40000000;
unsigned long int FBbt=0xc0000000;
unsigned int N=0, Nsrc=0, Nrep=0, Ncod=0;
unsigned int pn[2]={0,0}, qn[2]={0,0};
unsigned int qqn[4] ={6,2,2,6};
unsigned int Ncov;
main()
    {
    #include <time.h>
    #include <stdio.h>
        int i, j, k, Nlast, Nmax, Jcod, Jcod2;
```

```c
    int Nlst, Lmax, sm;
    int min, sec;
    unsigned int vc[32], wght[16], vcx[32], vcy[32];
    unsigned long int Nfac, Ifac, Jfac, Ntop;
    long int itime, itime0;

FILE *fptr;

/* The joint source-code probability matrix (for N vectors) is
   specified by the user.  The matrix can be of arbitrary but
   it should be an integer approximation of N times the joint
   probability matrix which minimizes (for source coding) for
   maximizes (for channel coding) the mutual information.     */ printf("Enter the QN matrix: ");
    scanf("%d %d %d %d", &qqn[0], &qqn[1], &qqn[2], &qqn[3]);

/* Here the source and reproduction marginal distributions are
   derived from qqn.                                          */
    for(i=0;i<r;i++)
    {   for(j=0;j<s;j++)
        {
        N+=qqn[i*s+j];
        pn[i]+=qqn[i*s+j];
        qn[j]+=qqn[i*s+j];
        }
    }
    fptr = fopen("code.dat","a");
    fprintf(fptr,"\n QQN = %d %d %d %d ",
        qqn[0],qqn[1],qqn[2],qqn[3]);

time(&itime0);
/* Enumerate the strictly typcial source and reproduction vectors
   of size N.               */

Ntop = 1;
    for(i=0;i<N;i++)
        Ntop*=r;
    for (Ifac=0; Ifac<Ntop; Ifac++)
```

```
{
    decomp( Ifac, vc, NBITR, (long)XMASK);
    for(i=0; i<r; i++) wght[i]=0;
    for(i=0; i<N; i++) wght[vc[i]]++;
    i=0;
    while (wght[i]==pn[i] && i<r) i++;
    if( i==r ) typsrc[Nsrc++] = Ifac;
}

Ntop = 1;
for (i=0;i<N;i++)
    Ntop*=s;
for (Ifac=0; Ifac<Ntop; Ifac++)
{
    decomp( Ifac, vc, NBITS, (long)YMASK);
    for(i=0; i<s; i++) wght[i]=0;
    for(i=0; i<N; i++) wght[vc[i]]++;
    i=0;
    while (wght[i]==qn[i] && i<s) i++;
    if( i==s ) typrep[Nrep++] = Ifac;
} time(&itime);

printf("%6d seconds elapsed \n",itime-itime0);
 printf("N= %d\n", N);
printf("There are %d source and %d reproduction words",
      Nsrc, Nrep);

i=0;
 Nlast = Numcov(i);
 Jcod2 = Nsrc/Nlast;

printf("\n Each %d codeword covers %d sourcewords ",
      Jcod2,Nlast);
   fprintf(fptr,
       "\n Each %d codeword covers %d sourcewords ",
       Jcod2,Nlast);
```

```
/* Here is the main loop where the new cover magnitude of each
   unused codeword is counted. If it equals Nlast then it must be
   maximal and is added as a code.  The next highest magnitude
   is saved as Lmax.  A list of codewords achieving Lmax is saved
   for the next level of elimination.  The loop terminates when
   all typical source words are covered.                       */ sm =0;
    while (sm<Nsrc)
    {
        Lmax=0;
        Nlst=0;
        for (i=0;i<Nrep;i++)
        {
            if( (FBbt & typrep[i])==0 )
            {
                k=Numcov (i);
                if(k==Nlast)
                {
                    sm+=k;
                    Newcode(i);

time(&itime);

min=(itime-itime0)/60; sec =(itime-itime0)%60;
#include "pnewcode.h"
                }
                else
                {
                    if(k==Lmax)
                        Clist[Nlst++]=i;
                    if(k> Lmax)
                    {
                        Lmax=k;
                        Nlst=0;
                        Clist[Nlst++]=i;
                    }
                }
            }
        }
    }
```

```
    printf("\nThe next level has %d codes to cover %d",
        N1st,Lmax);

if( N1st>0 )
    for(j=0;j<N1st;j++)
    {
        i=Clist[j];
        k=Numcov(i);
        if( k==Lmax )
        {
            sm+=k;
            Newcode(i);
            time(&itime);
            min=(itime-itime0)/60; sec =(itime-itime0)%60;
#include "pnewcode.h"
        }

}
    } fclose(fptr);

exit(0);
}

/* Decompose the word to a vector of letters    */ int decomp( i,vc, nbit, mask )
    unsigned long int i, mask;
    unsigned int *vc, nbit;
    {
    register int k;
    unsigned long int l;

for(k=0; k<N; k++)
        {
        l = mask & i;
        *(vc+k)=l;
```

```
            i>>=nbit;
        }
    }
/*  This returns 1 if vcy covers vcx, 0 otherwise */ int cover(vcx, vcy)
    unsigned long int vcx, vcy;

{
    int wght[16], rs;
    register int i,j;

rs = r*s;
    for(i=0; i<rs; i++) wght[i]=0;
    for(i=0; i<N; i++)
    {
        j=(vcx & XMASK)*s + (vcy & YMASK);
        wght[j]+=1;
        vcx>>=NBITR;
        vcy>>=NBITS;
    } i=0;
    while(wght[i]==qqn[i] && i<rs) i++;

if( i == rs )
        return(1);
    else
        return(0);

}
/* count the number of uncovered sources covered by typrep[Jcod]
                                                                */ int Numcov(Jcod)
    int Jcod;
    {
        register int k;
        unsigned long int srce, code;
```

```c
        code = typrep[Jcod];

Ncov=0;
    for(k=0; k<Nsrc; k++)
    {
        if( (Bt & typsrc[k]) == 0)
        {
            srce = typsrc[k];
            if( cover(srce,code)==1 )
                cov[Ncov++]=k;
        }
    }
    return(Ncov);
}

/* Append typrep[Jcod] to the codes list and
        mark all covered source words          */ int Newcode(Jcod)
int Jcod;
{
    register int k, i;
    unsigned long int srce, code;
    code = typrep[Jcod];

typrep[Jcod] = code | Bt;
    codes[Ncod++] = code;

for(i=0;i<Ncov;i++)
    {
        k=cov[i];
        typsrc[k]|= Bt;
    }
}

/* This chunk of code is used to print out the new codeword  */
/* It should be saved as a seperate file called FNEWCODE.H
{
```

```
       int j;
       printf("\n %4d:%2.2d> %3d covers %3d ",
                    min, sec, Ncod, k );
       fprintf(fptr, "\n %3d   %3d ", Ncod, k);
       Ifac = typrep[i];
       for(j=0;j<N;j++)
       {
           printf("%2d",Ifac&1);
           fprintf(fptr, "%2d", Ifac&1);
           Ifac>>=1;
       }
       fprintf(fptr, "%4d.%2.2d ", min,100*sec/60);
   }

*/
```

© JERRY NARDI 1989

TABLE II

```c
define XMASK 1 define YMASK 1 define NBITR 1 define NBITS 1 void Newcode();

unsigned long int Nchoose();

unsigned int covering();

void codcov();

void nxtcod();

void stripbt();

void nxtbit();

include <conio.h> int getche();

int kbhit();

unsigned long int bt0[32], bt1[32];

unsigned long int huge typsrc[50000];
unsigned long int huge typrep[50000];
unsigned int far cov[4000], far Clist[8000];
unsigned long int codes[2000];
unsigned long int Bt = 0x80000000, Fbt=0x40000000;
unsigned long int FBbt=0xc0000000, Cbt=0x0FFFFFFF;
unsigned long int Nsrc=0, Nrep=0;
unsigned int N=0, Ncod=0, pn[2]={0,0}, qn[2]={0,0};
```

```c
unsigned int qqn[2][2] ={{6,2},{2,6}}, r=2, s=2;
unsigned int Ncov, Brkch=0;
```

/* This program finds codewords (vectors Y) to cover all the
   typical sourcewords (vectors X).  The covering function is
   optimized for the standard fidelity criterion distortion
   only but can be modified for arbitrary D by changing Nxthit.*/
/* Output is appended to the file code.dat.                    */
/* The source and reproduction alphabets are binary.  The joint
   probability matrix can be arbitrary.                        */

```c
main()
    {
    #include <time.h>
    #include <stdio.h> unsigned long int i, j, k;
    double sm;
    unsigned int Nlast, Nmax, Jcod, Jcod2;
    unsigned int Nlst, Lmax, kflg, Ngood;
    int min, sec;
    unsigned int vc[32], wght[16], vcx[32], vcy[32];
    unsigned long int Nfac, Ifac, Jfac, Ntop, srce, code;
    long int itime, itime0;

FILE   *fptr;

printf("Enter the QN matrix: ");
    scanf("%d %d %d %d",
        &qqn[0][0], &qqn[0][1], &qqn[1][0], &qqn[1][1]);
```

```
for(i=0;i<r;i++)

for(j=0;j<s;j++)

{

N+=qqn[i][j];

pn[i]+=qqn[i][j];

qn[j]+=qqn[i][j];

}

Ifac = Nchoose(N,qn[0],1,1);

Jfac = Nchoose(qn[0],qqn[0][1],qn[1],qqn[1][0]);

Nlast= Jfac;

printf("\n %ld codewords each cover %ld sourcewords ",

Ifac, Jfac);

fptr = fopen("code.dat","a");

fprintf(fptr,"\n   QQN =  %3d %3d %3d %3d ", qqn[0][0],qqn[0][1],qqn[1][0],qqn[1][1]);

time(&itime0);

Ntop = 1;

for(i=0;i<N;i++)

Ntop*=2;

for (Ifac=0; Ifac<Ntop; Ifac++)

{ for(i=0; i<r; i++) wght[i]=0;

srce=Ifac;
```

```c
for(i=0;i<N;i++)
{
    j=(XMASK & srce);
    wght[j]++;
    srce>>=NBITR;
}
i=0;
while (wght[i]==pn[i] && i<r) i++;
if( i==r ) typsrc[Nsrc++] = Ifac;
/* Here it's assumed that the reproduction alphabet is the same
   as the source alphabet.                                    */
    j=0;
    while (wght[j]==qn[j] && j<s) j++;
    if( j==s ) typrep[Nrep++] = Ifac;
} time(&itime);
printf("%6d seconds elapsed \n",itime-itime0);
printf("N= %d\n", N);
printf("There are %ld source and %ld reproduction words",
    Nsrc, Nrep);

Jcod2=0;
if(Nlast>0) Jcod2 = Nsrc /Nlast;

printf("\n Each %d codeword covers %d sourcewords ",
    Jcod2,Nlast);
fprintf(fptr,
    "\n Each %d codeword covers %d sourcewords ",
    Jcod2,Nlast);
```

```c
/* Here is the main loop where the new cover magnitude of each
   unused codeword is counted. If it equals Nlast then it must be
   maximal and is added as a code.    The loop terminates when
   all codewords of maximal disjoint coverage are used up.    */

{
        for (i=0;i<Nrep;i++)
        {
            if( (FBbt & typrep[i])==0 )
            {
                k=covering (typrep[i]);
                if(k>=Nlast)
                {
                    sm+=k;
                    Newcode(i);
                    time(&itime);
                    min=(itime-itime0)/60; sec =(itime-itime0)%60;
{ /* this code prints out the new code word   */
    int j;
    printf("\n %4d:%2.2d> %3d covers %3d ",
                min, sec, Ncod, k );
    fprintf(fptr, "\n %3d    %3d ", Ncod, k);
    Ifac = typrep[i];
    for(j=0;j<N;j++)
    {
        printf("%2d",Ifac&1);
        fprintf(fptr, "%2d", Ifac&1);
        Ifac>>=1;
    }
```

```
        fprintf(fptr, "%4d.%2.2d ", min,100*sec/60);
}
                codcov(j);
            }

}
      }
    } fclose(fptr);

exit(0);
}

/* Append typrep[Jcod] to the codes list and
        mark all covered source words         */ void Newcode(Jcod)
    unsigned int Jcod;
    {
        register unsigned int k, i;
        unsigned long int srce, code;
        code = typrep[Jcod];
        typrep[Jcod] = code | Bt;
        codes[Ncod++] = code;

for (i=0;i<Ncov;i++)
        {
```

```
        k=cov[i];

typsrc[k]!= Bt;

}

} unsigned long int Nchoose(a,b,c,d)

unsigned int a,c,b,d;

{ long int k,l,m,n;

k=1;

l=1;

while(l<=b)

{ k*=(long)a--;

k/=(long)l++;

} m=1;

n=1;

while(n<=d)

{ m*=(long)c--;

m/=(long)n++;

} return(m*k);

}
```

```
/* Determine the number of source words covered by vc
   and save each new word to cov[].                       */ unsigned int covering(vc)

unsigned long int vc;

{ int istart, jstart;

unsigned long int mask;

register int i, k0, k1;

/*  Strip out the bits for 0's and 1's and put it bt      */ k0=0;

k1=0;

mask=1;

for (i=0;i<N;i++)

{ if( (mask & vc)==0 )

bt0[k0++]=mask;

else bt1[k1++]=mask;

mask<<=1;

}

/* Construct and test covered source words                */ mask = 0;

istart=qqn[1][0]-1;

jstart=qqn[0][1]-1;

Ncov=0;
```

```c
        nxtbit(&vc, mask, qn[0], qn[1], istart, jstart);

return(Ncov);
} void nxtbit( vc, mask, ilast, jlast, istart, jstart)
unsigned long int *vc, mask;
int ilast, istart, jlast, jstart;
{
    int i, j;
    unsigned long int isrc, ilo, ihi, srce, srctmp, maskx;

i=0;
    maskx=0;

if(istart>0)
    {
        for (i=istart; i<ilast; i++)
        {
            maskx = mask | bt0[i];
            nxtbit(vc, maskx, i, jlast, istart-1, jstart);
        }
    }
        if( (jstart>0) && (istart==0))
        {
```

```
    for (j=jstart; j<jlast; j++)

{ maskx = mask | bt1[j];

nxtbit(vc, maskx, ilast, j, istart, jstart-1);

}

} if( (istart==0) && (jstart==0))

{ for(i=0;i<ilast;i++)

for(j=0;j<jlast;j++)

{ maskx = mask | bt0[i] | bt1[j];

srce = maskx^*vc;

isrc = Nsrc/2;

ilo=0;

ihi=Nsrc-1;

srctmp=Cbt&typsrc[isrc];

while (srctmp!=srce)

{ if( srctmp<srce )

{ ilo=isrc;

isrc = isrc+(ihi-ilo+1)/2;

} if( srctmp>srce )

{ ihi=isrc;

isrc = isrc-(ihi-ilo+1)/2;
```

```
                    }
                srctmp=Cbt&typsrc[isrc];
            }
            if((Bt&typsrc[isrc])==0) cov[Ncov++]=isrc;
        }
    }
}

/* Determine the number of source words covered by vc
   and save each new word to cov[].                          */ void codcov(j)
unsigned long int j;
{
    int istart, jstart;
    unsigned long int vc, mask;
    int i, k, k0, k1;

/*  Strip out the bits for 0's and 1's and put it bt         */ for(k=0; k<Ncov; k++)
{
    vc=Cbt&typsrc[cov[k]];
/*  printf(" codes covered by %lu %d \n", vc, k); */
    k0=0;
    k1=0;
    mask=1;
```

```
    for (i=0;i<N;i++)
    {
        if( (mask & vc)==0 )
            bt0[k0++]=mask;
        else
            bt1[k1++]=mask;
        mask<<=1;
    }

/* Construct and test covered source words              */ mask = 0;
    istart=qqn[0][1]-1;
    jstart=qqn[1][0]-1;

nxtcod(&vc, mask, pn[0], pn[1], istart, jstart);
}
/*    return    */
} void nxtcod( vc, mask, ilast, jlast, istart, jstart)
unsigned long int *vc, mask;
int ilast, istart, jlast, jstart;
{
    int i, j;
    unsigned long int irep, ilo, ihi, repe, reptmp, maskx;
```

```c
        maskx=0;

if(istart>0)

{ for (i=istart; i<ilast; i++)

{
/*      printf("\n i= %d %lu %lu. %d %d %d %d ",
            i, *vc, mask, ilast, jlast, istart, jstart);*/
            maskx = mask | bt0[i];

nxtcod(vc, maskx, i, jlast, istart-1, jstart);

}

} if( (jstart>0) && (istart==0))

{ for (j=jstart; j<jlast; j++)

{
/*      printf("\n j= %d %lu %lu. %d %d %d %d ",
            j, *vc, mask, ilast, jlast, istart, jstart);*/
            maskx = mask | bt1[j];

nxtcod(vc, maskx, ilast, j, istart, jstart-1);

}

} if( (istart==0) && (jstart==0))

{ for(i=0;i<ilast;i++)

for(j=0;j<jlast;j++)

{
```

```
        maskx = mask | bt0[i] | bt1[j];

repe = maskx^*vc;

irep = Nrep/2;

ilo=0;

ihi=Nrep-1;

reptmp=Cbt&typrep[irep];

while (reptmp!=repe)

{
/*          printf("\n %lu %lu %lu %ld %ld ", ilo, irep, ihi, reptmp, repe);*/ if( reptmp<repe )

{ ilo=irep;

irep = irep+(ihi-ilo+1)/2;

} if( reptmp>repe )

{ ihi=irep;

irep = irep-(ihi-ilo+1)/2;

} reptmp=Cbt&typrep[irep];

} if((Bt&typrep[irep])==0) typrep[irep]!=Fbt;

}

}

}
```

& © JERRY NARDI 1989

TABLE III

```c
unsigned long int Nchoose();

unsigned int r=2, s=2, Nd=2;

unsigned int pn[2]={5,5}, N=10, D[2][2]={{0,1},{1,0}};

unsigned int cqqn[2][2];

main()

{ include <stdio.h> unsigned int    n, i, j, d, sm, Dm, bN;

unsigned int    Ncov, Ncmax;

unsigned int    qqn[2][2], qn[2], qm[2][2], b[2];

/* D is set above */ printf(" enter pN's: ");

scanf(" %d %d", pn, pn+1);

printf(" enter dN: ");

scanf(" %d",&Nd);

N = pn[0]+pn[1];

/* Loop through all possible values of the matrix entries
    to minimize finite approximation of mutual information.
    For channel coding: loop for minimum coverage subject to
    condition probabilities = cqqn and cost = bN (cqqn, bN,
    and b[] are defined by the user.                         */
```

```
{
Ncmax=0;

for(qqn[0][0]=0;qqn[0][0]<N; qqn[0][0]++)

for(qqn[0][1]=0;qqn[0][1]<N; qqn[0][1]++)

for(qqn[1][0]=0;qqn[1][0]<N; qqn[1][0]++)

for(qqn[1][1]=0;qqn[1][1]<N; qqn[1][1]++)

{

/* Find all the restricted values. */ n=0;

d=0;

for(i=0;i<r;i++)

{ sm=0;

for(j=0;j<s;j++)

{ n += qqn[i][j];

d += D[i][j]*qqn[i][j];

sm+= qqn[i][j];

} if(sm != pn[i]) break;

}
/* Does the total count add to N?    */
/* Do the X marginals equal pn?    */
/* Does the average distortion agree?*/ if( n==N )

if( i==r )

if( d==Nd )

{
```

```c
/* Count the number of vectors covered by this qqn matrix */

Ncov=1;

for(j=0;j<s;j++)

{ qn[j]=0;

for(i=0;i<r;i++)

qn[j]+=qqn[i][j];

Ncov*= Nchoose(qn[j],qqn[r-1-j][j],1,1);

}

/* If this is the maximum number covered so far then
   save the matrix in matrix qm. Aslo update Ncmax      */ if( Ncov >= Ncmax)

{

Dm=d;

Ncmax=Ncov;

for(i=0;i<r;i++)

for(j=0;j<s;j++)

qm[i][j]=qqn[i][j];

}

}

}

} for(i=0;i<r;i++)

printf(" %d %d \n", qm[i][0], qm[i][1]);

for(j=0;j<s;j++)

{ qn[j]=0;

for(i=0;i<r;i++)

qn[j]+=qm[i][j];
```

```
            } printf("\n distortion: %d, covers %d, qn= %d %d \n",
                  Dm, Ncmax, qn[0], qn[1]);

}
} unsigned long int Nchoose(a,b,c,d)
unsigned int a,c,b,d;
{
   long int k,l,m,n;

k=1;
   l=1;
   while(l<=b)
   {
      k*=(long)a--;
      k/=(long)l++;
   }
   m=1;
   n=1;
   while(n<=d)
   {
      m*=(long)c--;
      m/=(long)n++;
   } return(m*k);
}
```

© JERRY NARDI 1989

What is claimed is:

1. A method of selecting at least one code word from a set of second data, said at least one code word being selected to represent data in a set of first data, said sets of first and second data each having at least one data group, the method comprising the steps of:
    determining for one of said at least one data group of said set of second data, all those data groups in said set of first data covered by said one of said at least one data group of said set of second data;
    selecting as one of said at least one code word the one of said at least one data group of said set of second data which covers the maximum number of data groups remaining in said set of first data;
    eliminating the covered data groups from said set of first data; and
    repeating the above steps until a given criteria is satisfied.

2. The method according to claim 1, wherein said first data comprises source words and said second data comprises reproduction words.

3. The method according to claim 1, wherein said given criteria is that all data groups in said set of first data are covered.

4. The method according to claim 1, wherein said step of determining comprises the step of selecting a joint probability matrix Q that minimizes mutual information of said set of first data with respect to said set of second data.

5. The method according to claim 4, wherein sets of first and second data groups each consists of N elements and said step of determining further comprises the step of determining that a data group of said first set is covered by a data group of said second set if, when the elements of the two data groups are paired, each pair with first data element i and second data element j occurs exactly $NQ_{ij}$ times.

6. The method according to claim 1, further comprising after the step of eliminating the covered data groups from said set of first data, the steps of determining for each of the covered data groups in the set of first data, all those data groups in the set of second data covered by each of the data groups in the set of first data and eliminating each data group in said set of second data which is covered by said covered data groups in said set of first data.

7. The method according to claim 6, wherein said given criteria is that all data groups in said set of first data are covered or all data groups in said set of second data are eliminated.

8. The method according to claim 6, wherein said step of determining comprises the step of selecting a joint probability matrix Q that minimizes mutual information of said set of first data with respect to said set of second data.

9. The method according to claim 8, wherein said sets of first and second data groups each consists of N elements and said step of determining further comprises the step of determining that a data group of said first set is covered by a data group of said second set if, when the elements of the two data groups are paired, each pair with first data element i and second data element j occurs exactly $NQ_{ij}$ times.

10. A method of selecting a set of code words representing first data comprised of at least one character from a first arbitrary alphabet, said method adapted for use in data transmission devices, comprising the steps of:
    (a) determining a set of first vectors representing the first data;
    (b) determining a set of second vectors from a second arbitrary alphabet;
    (c) selecting as a first code word in the set of code words one of said set of second vectors;
    (d) determining the number of the first vectors of those remaining in said set of first vectors which are covered by each of said second vectors;
    (e) eliminating from said set of first vectors all those vectors covered by said first code word;
    (f) selecting as a next code word in the set of code words a second vector covering a maximum number of first vectors of those remaining in said set of first vectors;
    (g) eliminating the first vectors covered by the next code word from the set of first vectors;
    (h) repeating steps (e) through (g) until a given criteria is satisfied.

11. The method according to claim 10, wherein said first and second vectors comprise first strictly typical source vectors and second strictly typical reproduction vectors, respectively.

12. The method according to claim 11, wherein said given criteria is that all vectors in said set of second vectors are eliminated.

13. The method according to claim 11, wherein said step of determining the number of covered vectors comprises the step of selecting a joint probability matrix Q that minimizes mutual information of said set of first vectors with respect to said set of second vectors.

14. The method according to claim 13, wherein said first and second set of vectors each consists of N elements and said step of determining the number of covered vectors further comprises the step of determining that a vector of said first set is covered by a vector of said second set if, when the elements of the two vectors are paired, each pair with first vectors element i and second vectors element j occurs exactly $NQ_{ij}$ times.

15. The method according to claim 11, further comprising, after the step of eliminating the covering vectors from the set of first vectors, the steps of determining for each of the covered vectors in the set of first vectors, all those vectors in the set of second vectors covered by each of the covered vectors in the set of first vectors and eliminating each vector in said set of second vectors which is covered by said covered vectors in said set of first vectors.

16. The method according to claim 15, wherein said given criteria is that all vectors in said set of first vectors are covered or all vectors in said set of second vectors are eliminated.

17. The method according to claim 15, wherein said step of determining the number of covered vectors comprises the step of selecting a joint probability matrix Q that minimizes mutual information.

18. The method according to claim 17, wherein said first and second set of vectors each consists of N elements and said step of determining the number of covered vectors further comprises the step of determining that a vector of said first set is covered by a vector of said second set if, when the elements of the two vectors are paired, each pair with first vectors element i and second vectors element j occurs exactly $NQ_{ij}$ times.

19. A device for selecting at least one code word from a set of second data said at least one code word being selected to represent data in a set of first data, said sets of first and second data having at least one data group, said device comprising:

- determining means for determining, for one of said at least one data group of said set of second data, all those data groups in said set of first data covered by said one of said set of second data;
- selecting means for selecting as one of said at least one code word the one of said at least one data group of said set of second data which covers the maximum number of data groups of the data groups remaining in said set of first data;
- eliminating means for eliminating the covered data groups from said set of first data; and
- means for repeating the above steps until a given criteria is satisfied.

20. The device according to claim 19, wherein said first data comprises source words and said second data comprises reproduction words.

21. The device according to claim 19, wherein said given criteria is that all data groups in said set of first data are covered.

22. The device according to claim 19, further comprising selecting means for selecting a joint probability matrix Q that minimizes mutual information of said set of first data with respect to said set of second data.

23. The device according to claim 22, wherein said sets of first and second data groups each consists of N elements and said determining means further comprises determining means for determining that a data group of said first set is covered by a data group of said second set if, when the elements of the two data groups are paired, each pair with first data element i and second data element j occurs exactly $NQ_{ij}$ times.

24. The device according to claim 19, further comprising determining means for determining, for each covered data group in said set of first data, all those data groups in said set of second data covered by said one of said set of first data and eliminating means for eliminating each data group in said set of second data groups which is covered by said covered data groups in said set of first data.

25. The device according to claim 24, wherein said given criteria is that all data groups in said set of first data are covered or all data groups in said set of second data groups are eliminated.

26. The device according to claim 24, further comprising selecting means for selecting a joint probability matrix Q that minimizes mutual information of said set of first data with respect to said set of second data.

27. The device according to claim 26, wherein said sets of first and second data groups each consisfts of N elements and said determining means further comprises determining means for determining that a data group of said first set is covered by a data group of said second set if, when the elements of the two data groups are paired, each pair with first data element i and second data element j occurs exactly $NQ_{ij}$ times.

* * * * *